United States Patent
Ku et al.

(10) Patent No.: US 7,741,699 B2
(45) Date of Patent: Jun. 22, 2010

(54) SEMICONDUCTOR DEVICE HAVING ULTRA-SHALLOW AND HIGHLY ACTIVATED SOURCE/DRAIN EXTENSIONS

(75) Inventors: Keh-Chiang Ku, Sindan (TW); Chun-Feng Nieh, Baoshan Township (TW); Li-Ping Huang, Taipei (TW); Chih-Chiang Wang, Hsin-Chu (TW); Chien-Hao Chen, Chuangwei Township (TW); Hsun Chang, Hsin-Chu (TW); Li-Ting Wang, Tainan (TW); Tze-Liang Lee, Hsin-Chu (TW); Shih-Chang Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 400 days.

(21) Appl. No.: 11/521,660

(22) Filed: Sep. 15, 2006

(65) Prior Publication Data

US 2007/0284615 A1  Dec. 13, 2007

Related U.S. Application Data

(60) Provisional application No. 60/812,393, filed on Jun. 9, 2006.

(51) Int. Cl.
*H01L 29/00* (2006.01)

(52) U.S. Cl. .............................. 257/550; 257/E21.634; 438/306

(58) Field of Classification Search .................. 257/408, 257/549–550, E29.266, E29.267, E29.268, 257/E29.269, E29.278, E29.279, E21.634; 438/306
See application file for complete search history.

(56) References Cited

U.S. PATENT DOCUMENTS

| | | | |
|---|---|---|---|
| 4,755,865 | A | 7/1988 | Wilson et al. |
| 5,108,935 | A | 4/1992 | Rodder |
| 5,262,664 | A | 11/1993 | Jung-Suk |
| 5,576,226 | A | 11/1996 | Hwang |
| 5,585,286 | A | 12/1996 | Aronowitz et al. |
| 5,719,425 | A | 2/1998 | Akram et al. |
| 5,885,861 | A | 3/1999 | Gardner et al. |
| 5,933,721 | A | 8/1999 | Hause et al. |

(Continued)

*Primary Examiner*—David Vu
(74) *Attorney, Agent, or Firm*—Slater & Matsil, L.L.P.

(57) ABSTRACT

A semiconductor device includes a gate stack over a semiconductor substrate, a lightly doped n-type source/drain (LDD) region in the semiconductor substrate and adjacent the gate stack wherein the LDD region comprises an n-type impurity, a heavily doped n-type source/drain (N+ S/D) region in the semiconductor substrate and adjacent the gate stack wherein the N+ S/D region comprises an n-type impurity, a pre-amorphized implantation (PAI) region in the semiconductor substrate wherein the PAI region comprises an end of range (EOR) region, and an interstitial blocker region in the semiconductor substrate wherein the interstitial blocker region has a depth greater than a depth of the LDD region but less than a depth of the EOR region.

11 Claims, 9 Drawing Sheets

U.S. PATENT DOCUMENTS

| | | |
|---|---|---|
| 5,959,333 A | 9/1999 | Gardner et al. |
| 6,225,151 B1 | 5/2001 | Gardner et al. |
| 6,268,640 B1 * | 7/2001 | Park et al. .................... 257/607 |
| 6,271,095 B1 | 8/2001 | Yu |
| 6,458,641 B2 | 10/2002 | Tsukamoto |
| 6,475,885 B1 | 11/2002 | Sultan |
| 6,521,502 B1 * | 2/2003 | Yu ............................. 438/305 |
| 6,555,439 B1 | 4/2003 | Xiang et al. |
| 6,680,250 B1 | 1/2004 | Paton et al. |
| 6,830,980 B2 * | 12/2004 | Mansoori et al. ............ 438/308 |
| 7,064,399 B2 * | 6/2006 | Babcock et al. ............. 257/408 |
| 7,498,642 B2 * | 3/2009 | Chen et al. |
| 2004/0031970 A1 | 2/2004 | Chakravarthi et al. |
| 2004/0087120 A1 * | 5/2004 | Feudel et al. ............... 438/525 |
| 2004/0102013 A1 | 5/2004 | Hwang et al. |
| 2004/0173855 A1 | 9/2004 | Masuoka et al. |
| 2005/0085055 A1 | 4/2005 | Tan et al. |
| 2005/0110082 A1 | 5/2005 | Cheng et al. |
| 2006/0006427 A1 * | 1/2006 | Tan et al. .................... 257/227 |
| 2006/0051922 A1 | 3/2006 | Huang et al. |
| 2006/0216900 A1 * | 9/2006 | Wang et al. |
| 2006/0234455 A1 * | 10/2006 | Chen et al. |

* cited by examiner

SEMICONDUCTOR DEVICE HAVING ULTRA-SHALLOW AND HIGHLY ACTIVATED SOURCE/DRAIN EXTENSIONS

This application claims the benefit of U.S. Provisional Application No. 60/812,393, filed on Jun. 9, 2006, entitled "Ultra-Shallow and Highly Activated Source/Drain Extension Formation Using Phosphorus," which application is hereby incorporated herein by reference.

TECHNICAL FIELD

This invention is related generally to semiconductor devices, and more particularly to the formation of MOS devices with ultra-shallow junctions.

BACKGROUND

As the dimensions of transistors are scaled down, the reduction of vertical junction depth and the suppression of dopant lateral diffusion, in order to control short-channel effects, become greater challenges. MOS devices have become so small that the diffusion of impurities from source/drain extension regions and deep source/drain regions will significantly affect the characteristics of the MOS devices. Particularly, impurities from source/drain extension regions are readily diffused into the channel region, causing short channel effects and leakage currents between the source and drain regions. Methods for controlling diffusion are thus explored.

A first method of confining the diffusion of p-type or n-type impurities is discussed below. As is shown in FIG. 1, a gate electrode 6 is formed over a substrate 2. N-type dopants and/or p-type dopants are introduced into the gate electrode 6 and source/drain regions 8 of NMOS devices and PMOS devices, respectively. Arrows 10 symbolizes the implantation. For n-type devices, nitrogen and fluorine are co-implanted to source/drain regions 8, and for p-type devices, nitrogen and carbon are co-implanted to source/drain regions 8. Nitrogen, carbon, and fluorine have the function of retarding the diffusion of dopants. Therefore, the diffusion of the dopants is controlled when the MOS devices are annealed, and thus the source/drain regions 8 have higher impurity concentrations and more confined profiles.

A second method for confining the profile of phosphorus in deep source/drain regions 16 of NMOS devices is illustrated in FIG. 2. After the formation of a gate electrode 12 over a substrate 20, LDD regions 14 are formed by introducing an n-type dopant such as arsenic. Spacers 11 are then formed. Symbolized by arrows 22, phosphorus is introduced to form deep source/drain regions 16. Carbon or fluorine is also implanted into the same regions. The addition of carbon or fluorine makes relatively high concentrations of phosphorus possible since less is diffused away, and transistor drive current is improved without unduly compromising the short channel characteristics.

For high performance devices, shallow and highly activated lightly doped source/drain (LDD) regions are desired. Typically, arsenic is preferred for forming LDD regions for its low diffusion length. However, the corresponding sheet resistance is relatively high due to its low activation level, thus limiting device performance, such as drive currents, of NMOS devices. Another commonly used n-type dopant, phosphorus, is known to have a high activation level but a long diffusion length, thus the junction depth is adversely affected, and diffusion into the channel region is also significant. Therefore, the formation of shallow and highly activated LDD regions is one of the challenges in integrated circuit fabrication technologies.

SUMMARY OF THE INVENTION

In accordance with one aspect of the present invention, a semiconductor device includes a gate stack over a semiconductor substrate, a lightly doped n-type source/drain (LDD) region in the semiconductor substrate and adjacent the gate stack wherein the LDD region comprises an n-type impurity, such as phosphorus, a heavily doped n-type source/drain (N+ S/D) region in the semiconductor substrate and adjacent the gate stack wherein the N+ S/D region comprises an n-type impurity, a pre-amorphized implantation (PAI) region in the semiconductor substrate wherein the PAI region comprises an end of range (EOR) region, and an interstitial blocker region in the semiconductor substrate wherein the interstitial blocker region has a depth greater than a depth of the LDD region but less than a depth of the EOR region.

In accordance with another aspect of the present invention, a semiconductor device includes a semiconductor substrate with a channel region, a gate dielectric over the channel region, a gate electrode over the gate dielectric, a lightly n-type doped source/drain (LDD) region substantially aligned with an edge of the gate electrode wherein phosphorus is the only n-type impurity in the LDD region, a heavily doped n-type source/drain (N+ S/D) region in the semiconductor substrate, a pre-amorphized implantation (PAI) region comprising germanium in the semiconductor substrate wherein the PAI region comprises an end of range (EOR) region substantially deeper than a bottom border of the LDD region, and an interstitial blocker region comprising carbon in the semiconductor substrate wherein the LDD region and the EOR region are separated by at least a portion of the interstitial blocker region.

In accordance with another aspect of the present invention, a method for forming a semiconductor device includes providing a semiconductor substrate, forming a gate stack over the semiconductor substrate, forming a pre-amorphized implantation (PAI) region in the semiconductor substrate wherein the PAI region comprises an end of range (EOR) region, forming a lightly doped source/drain (LDD) region in the semiconductor substrate and adjacent the gate stack wherein the LDD region comprises phosphorus, forming an interstitial blocker region in the semiconductor substrate after the step of forming the PAI region wherein the interstitial blocker region has a depth greater than a depth of the LDD region but less than a depth of the EOR region, and forming a heavily doped n-type source/drain (N+ S/D) region in the semiconductor substrate and adjacent the gate stack.

In accordance with yet another aspect of the present invention, a method for forming a semiconductor device includes providing a semiconductor substrate, forming a gate stack over the semiconductor substrate, implanting germanium to form a pre-amorphized implantation (PAI) region in the semiconductor substrate wherein the PAI region comprises an end of range (EOR) region, forming a carbon-comprising interstitial blocker region in the semiconductor substrate, implanting an lightly doped n-type source/drain (LDD) region in the semiconductor substrate and adjacent the gate stack wherein n-type impurities in the LDD region comprise only phosphorus and wherein the interstitial blocker region has a depth greater than a depth of the LDD region but less than a depth of the EOR region, and implanting a heavily doped n-type source/drain (N+ S/D) region in the semiconductor substrate and adjacent the gate stack.

By forming an interstitial blocker region between the end of range (EOR) region and the LDD regions, the diffusion of phosphorous in the LDD regions is reduced. Since phosphorous has a high activation rate, the resulting MOS device has a low sheet resistance.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In order to manufacture a high performance NMOS device, the source/drain regions preferably have low sheet resistance and shallow junctions. However, these two requirements often conflict with each other. To reduce sheet resistance, more dopants have to be implanted and activated. Typically, this causes more dopants to diffuse away from the implanted region, and the junction depth is increased. The preferred embodiments of the present invention use phosphorous as the dopant in the source/drain extension regions (also referred to as lightly doped source/drain regions, or LDD regions). By controlling the diffusion of phosphorous, the LDD regions have a high phosphorus concentration. Since phosphorous has a high activation rate, the sheet resistance is reduced also. The cross-sectional views of the intermediate stages in the manufacture of the preferred embodiment are illustrated in FIGS. 3 through 8C, wherein like reference numbers are used to designate like elements throughout the various views and illustrative embodiments of the present invention.

Figure 1:
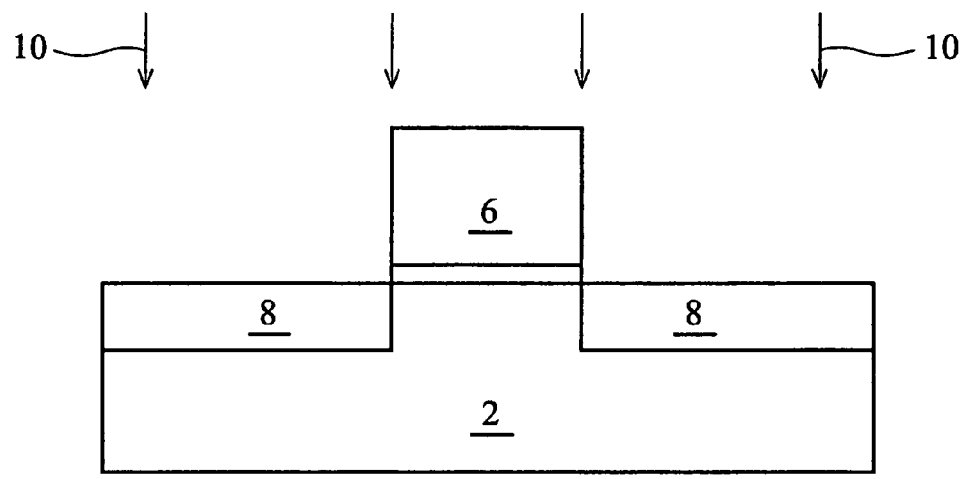
FIG. 1 illustrates a conventional method of making MOS devices, wherein nitrogen and fluorine are used to retard diffusion of n-type impurities, and nitrogen and carbon are used to retard diffusion of p-type impurities.
Figure 2:
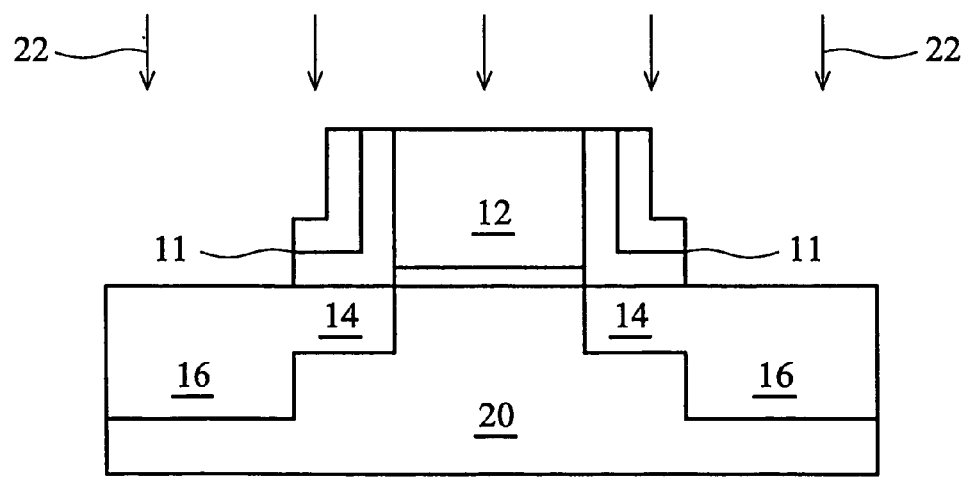
FIG. 2 illustrates a conventional method of making NMOS devices by co-implanting phosphorus with carbon or fluorine.
Figure 3:
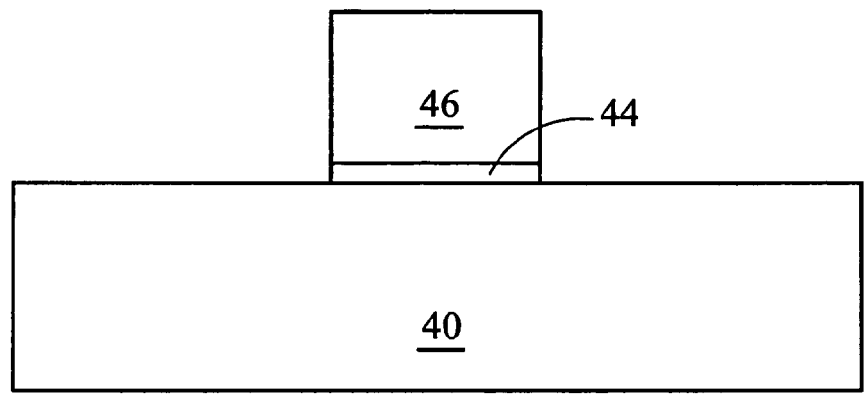
FIGS. 3 through 8C are cross-sectional views of intermediate stages in the manufacture of a first NMOS device embodiment according to the principles of the present invention.

FIG. 3 illustrates a gate stack, which includes a gate dielectric 44 formed on a substrate 40, and a gate electrode 46 formed on gate dielectric 44. Substrate 40 is preferably a silicon substrate, and may have a silicon-on-insulator (SOI) structure. Alternatively, substrate 40 can be formed of common substrate materials such as SiGe, strained silicon on SiGe, and the like. Gate dielectric 44 preferably includes oxides, such as thermal oxide. Alternatively, gate dielectric 44 comprises nitrides, oxynitrides, oxycarbides, high dielectric constant (k value) materials, and combinations thereof. As is known in the art, to form the gate stack, a gate dielectric layer is formed on substrate 40, followed by the formation of a gate electrode layer. The gate electrode layer and the gate dielectric layer are then patterned to form gate electrode 46 and gate dielectric 44, respectively.

Figure 4:
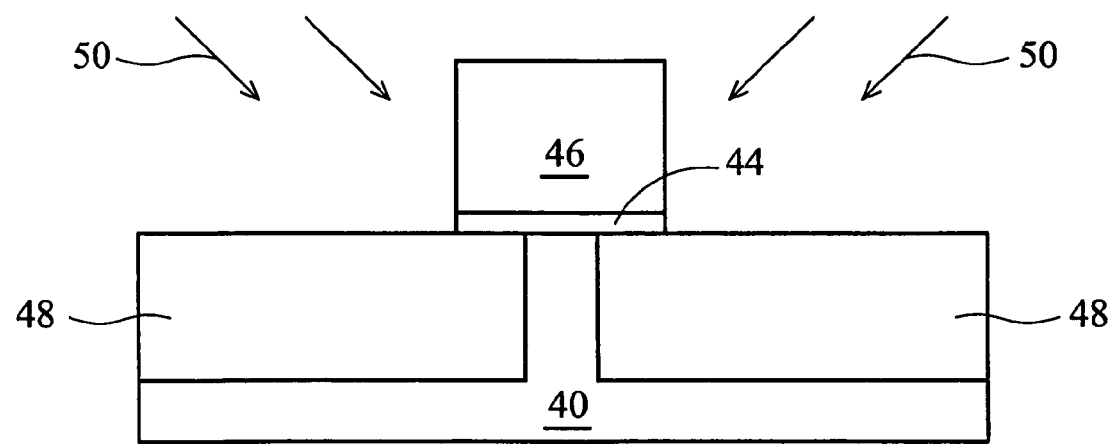

FIG. 4 schematically illustrates the formation of pocket/halo regions 48 through the implantation of p-type impurities, such as boron or indium. Tilt implants, as symbolized by arrows 50, are preferably performed at a tilt angle of less than about 50 degrees, and p-type implant regions 48 are formed. As is known in the art, more than one implantation is preferably conducted to form pocket/halo regions 48 in desired regions. In the preferred embodiment, p-type pocket/halo regions 48 are located around the side borders and junction of the subsequently formed source/drain regions (including LDD regions) to neutralize the diffusion of the n-type impurities.

Figure 5:
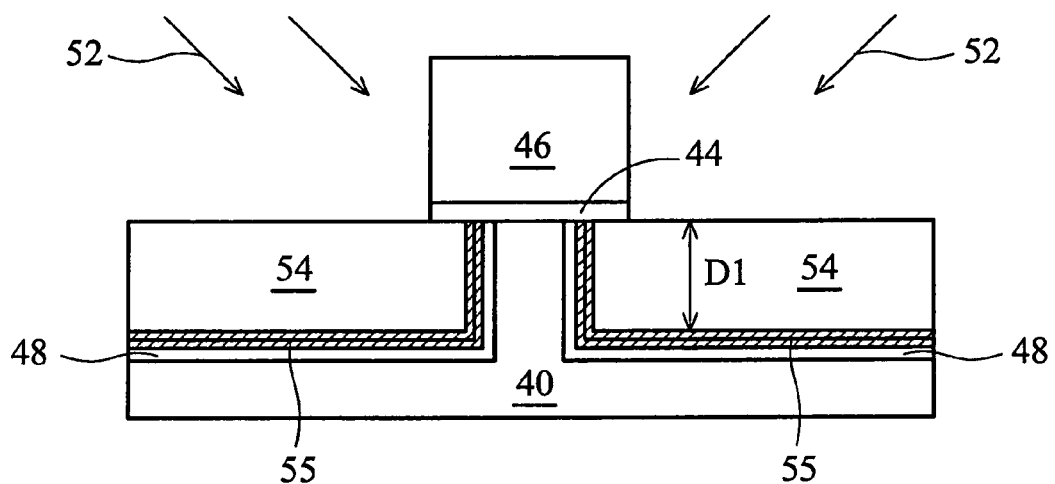

Referring to FIG. 5, a pre-amorphized implantation (PAI), as symbolized by arrows 52, is performed in order to reduce the dopant channeling effect and to enhance dopant activation. PAI regions 54 are thus formed. In the preferred embodiment, germanium is implanted. In other embodiments, silicon is used. The pre-amorphized implantation prevents subsequently doped impurities from channeling through spaces between the crystal lattice structure and reaching depths greater than desired. In addition, the pre-amorphized implantation is beneficial for the subsequent implanted carbon to occupy lattices upon subsequent annealing due to the re-crystallization process during the annealing. Lines 55 schematically mark end-of-range (EOR) regions, which are portions of the PAI regions 54. EOR regions 55 are where most of the implanted germanium ions stop, and thus have a high interstitial concentration. Although EOR regions 55 are shown as lines, it should be realized that they are actually a strip of regions, and likely to be deeper than the peak of a Gaussian distribution of the germanium.

PAI is preferably performed at a tilt angle of less than about 50 degrees. Two tilted implants are preferably performed, with one tilting toward the other, and thus forming PAI regions 54. The preferred implant energy for germanium is between about 5 keV and about 40 keV, and more preferably about 20 keV. The resulting depth D1 (See FIG. 8A) is preferably greater than the junction depth of the subsequently formed source/drain regions as well as source/drain extension regions. The preferred dosage is between about $1E14/cm^2$ and about $1E15/cm^2$, and more preferably about $5E14/cm^2$.

Figure 6:
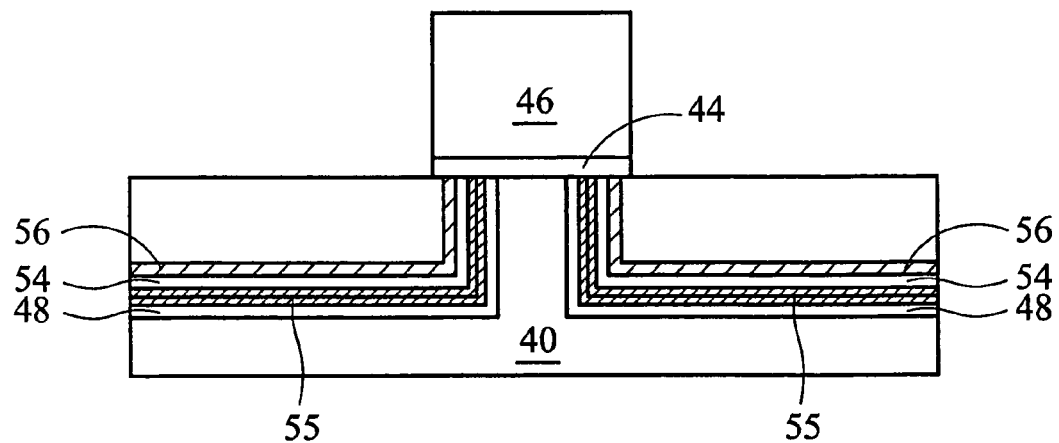

FIG. 6 illustrates the formation of interstitial blocker regions 56, which are preferably formed by implanting carbon. Preferably, the implants are tilted at tilt angles less than about 50 degrees. At least two tilted implants are preferably performed, with one tilting toward the other, and thus forming interstitial blocker regions 56. With tilt implantation, the interstitial blocker regions 56 extend under the gate electrode 46, and thus a better effect is achieved. In this case, a channel region under gate electrode 46 may be free from interstitial blocker regions 56. The preferred dose is between about $5E14/cm^2$ and about $5E15/cm^2$, and more preferably about $1E15/cm^2$. The preferred energy is between about 3 keV and about 10 keV, and more preferably about 5 keV. FIG. 6 illustrates interstitial blocker regions 56 as strips. It should be realized that carbon is likely to have, for example, a Gaussian distribution with a small amount extending into deeper and shallower regions, and even to the surface of substrate 40. Strips 56 only illustrate a region having the highest concentration. In the preferred embodiment, carbon is implanted using only one energy (as compared to implantations using several different energies in order to have a wide distribution). In other embodiments, carbon may use energies in a narrow range, for example, with an energy difference between the highest and lowest energies less than about 3 keV. In yet other embodiments, a wide range of energies are used, so that carbon extends all the way to the surface of substrate 40.

Figure 7:
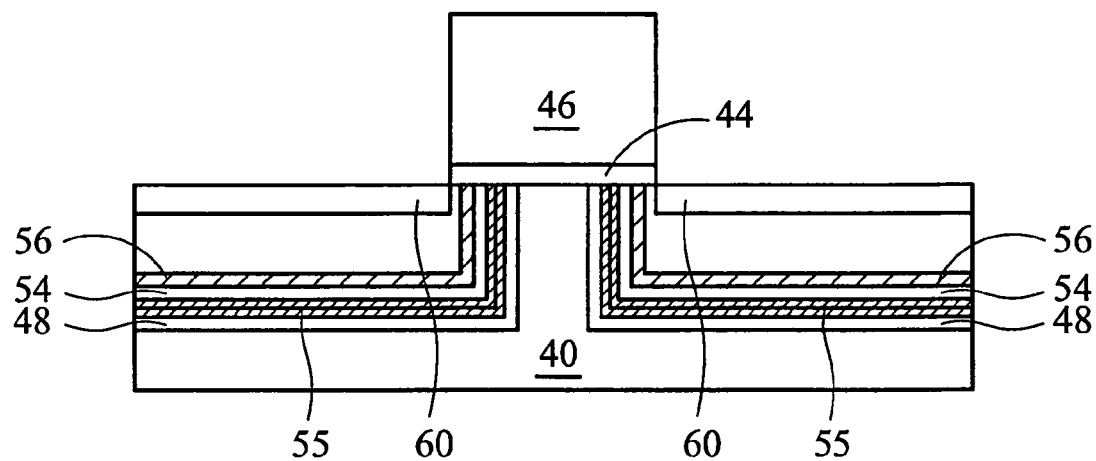

Referring to FIG. 7, lightly doped drain/source (LDD) regions 60 are formed, preferably by implanting phosphorus. Alternatively, arsenic can be implanted together with phosphorous. The phosphorus dosage in LDD regions 60 is preferably between about $1E14/cm^2$ and about $1E16/cm^2$, and more preferably about $1E15/cm^2$. The formation details are well known in the art, thus are not repeated herein.

Figure 8A:
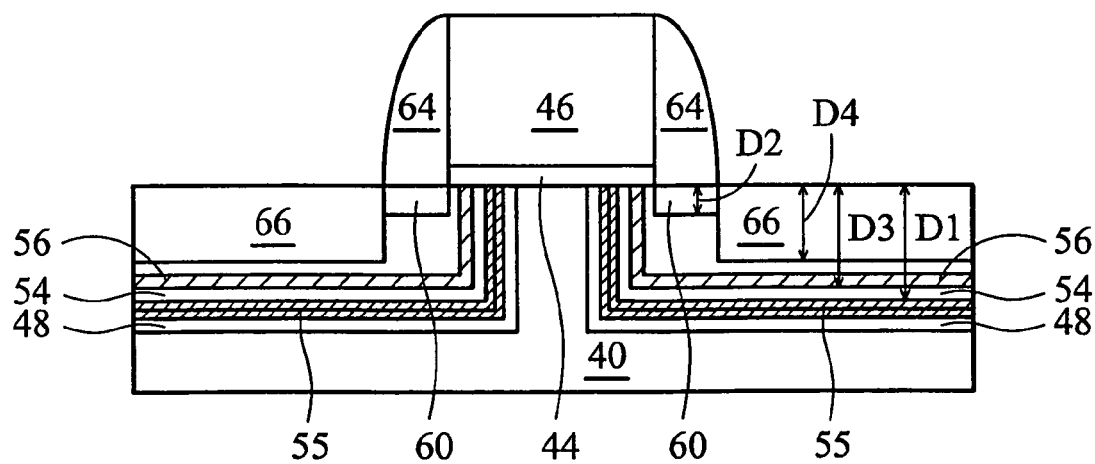
Figure 8B:
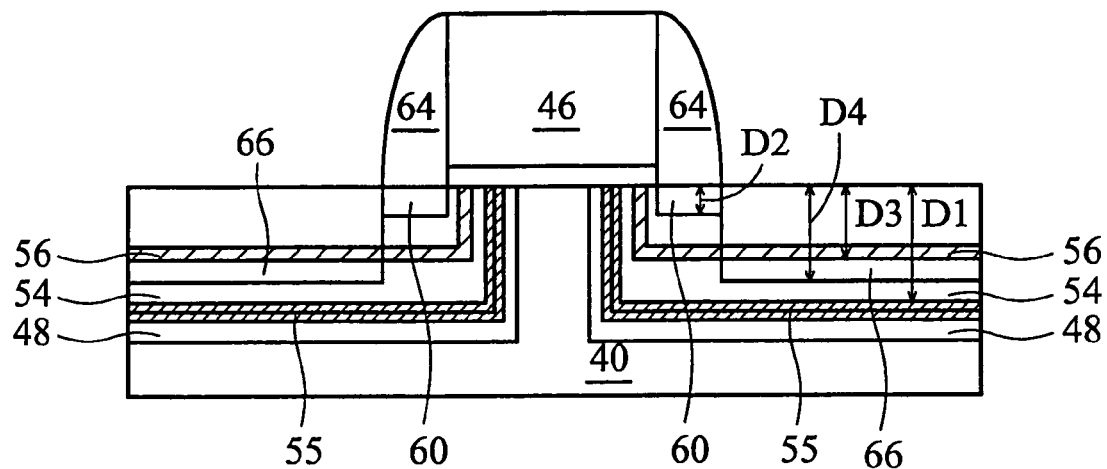
Figure 8C:
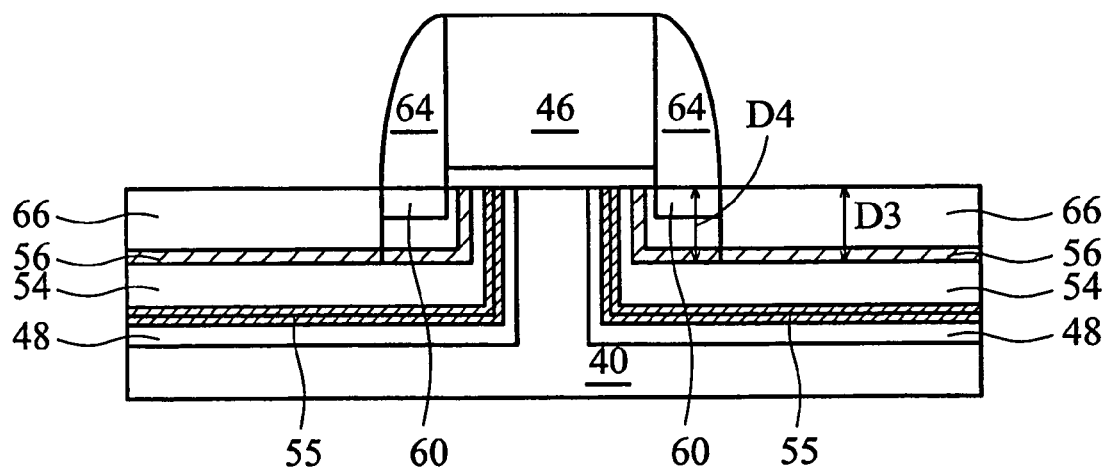

FIGS. 8A, 8B and 8C illustrate the formation of spacers 64 and heavily doped n-type source/drain (N+ S/D) regions 66. As is known in the art, spacers 64 may be formed by blanket depositing a dielectric layer, then removing the dielectric layer from horizontal surfaces, and thus leaving spacers 64 along the sidewalls of gate dielectric 44 and gate electrode 46.

Spacers 64 are used as masks for the formation of the N+ S/D regions 66, as is also illustrated in FIGS. 8A, 8B and 8C. N-type impurities, preferably phosphorus, are preferably implanted, and the resulting N+ S/D regions have a depth D4. Alternatively, arsenic, or a combination of arsenic and phosphorous, may be implanted. The dosage of the implantation is preferably between about $5E15/cm^2$ and about $6E15/cm^2$. FIG. 8A illustrates a preferred embodiment, wherein interstitial blocker regions 56 are deeper than both N+ S/D regions 66 and LDD regions 60. Interstitial blocker regions 56 thus block interstitials in the EOR region 55 from diffusing into N+ S/D regions 66 and LDD regions 60. FIG. 8B illustrates alternative embodiments wherein interstitial blocker regions 56 are shallower than N+ S/D regions 66 but deeper than LDD regions 60. Interstitial blocker regions 56 thus block interstitials in the EOR regions 55 from diffusing into LDD regions 60. In a more preferred embodiment, as shown in FIG. 8C, interstitial blocker regions 56 have a depth D3 substantially close to a depth D4 of N+ S/D regions 66. As a result, interstitial blocker regions 56 not only block interstitials in EOR region 55 from diffusing into LDD regions 60, but they also retard the diffusion of impurities into N+ S/D regions 66 due to the presence of carbon.

The dopants introduced in previously discussed processes are then activated. The activation is preferably performed using rapid thermal annealing (RTA). The RTA is preferably performed at a temperature of, for example, between about 950° C. and about 1100° C. In an exemplary embodiment, the temperature is about 1020° C. Alternatively, the activation is conducted using commonly used methods such as furnace annealing, laser annealing, flash annealing, and the like.

Figure 9:
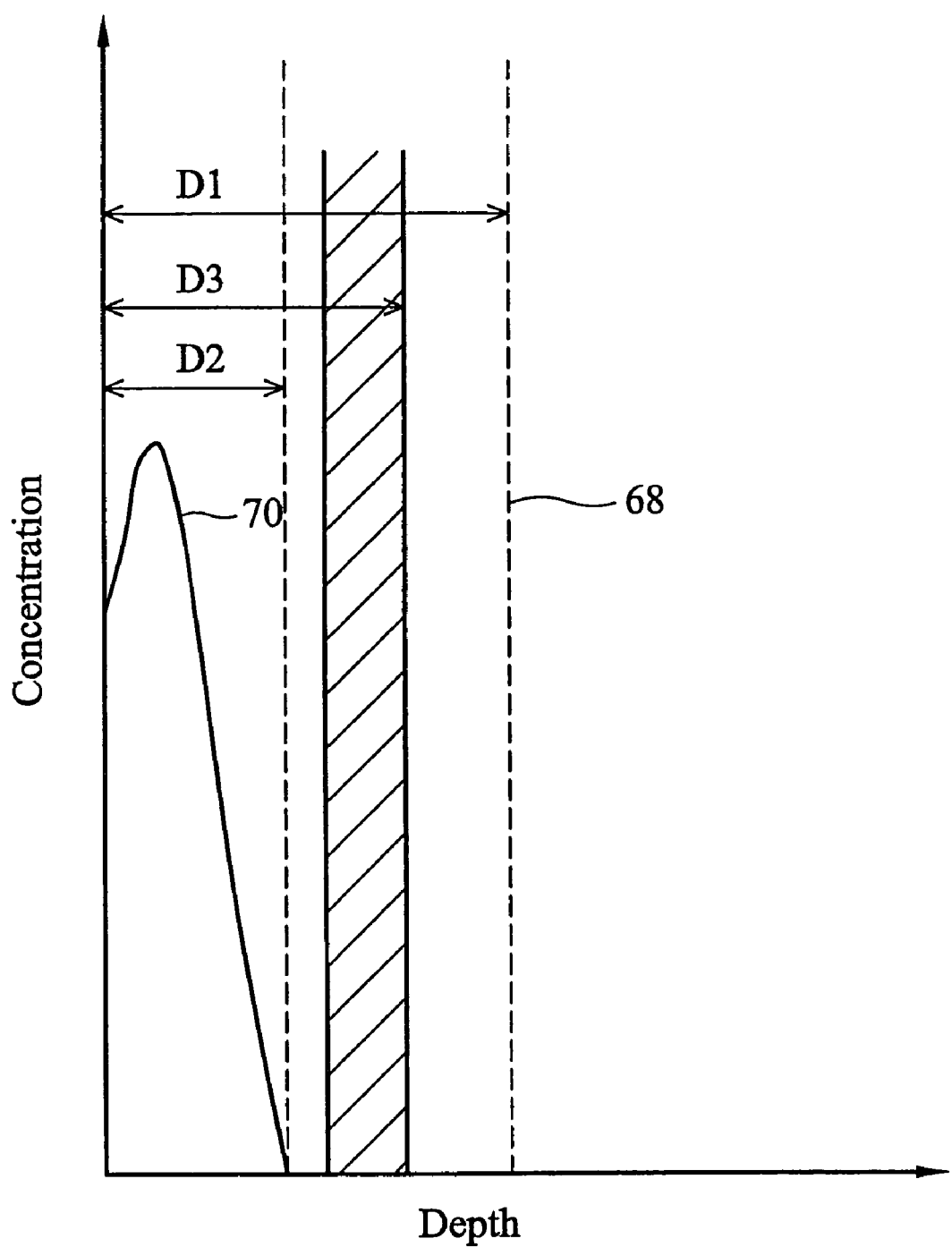
FIG. 9 schematically illustrates a mechanism of the preferred embodiment of the present invention.

FIG. 9 schematically illustrates a possible mechanism occurring during the activation. The X-axis represents a depth from the surface of substrate 40 and the Y-axis represents phosphorus concentration. In the preferred embodiment, LDD regions have a depth D2, wherein the distribution of phosphorous in the LDD regions is shown as line 70. The interstitial blocker regions (shaded area) have a depth D3, and the EOR regions (located deeper than a dotted line 68) have a depth D1 (please also refer to FIGS. 8A, 8B and 8C). As discussed in the preceding paragraphs, the depth D1 of the EOR regions is greater than the depth D3 of the interstitial blocker regions, and the depth D3 of the interstitial blocker regions is greater than depth D2 of the LDD regions. As a result, there is an interstitial blocker region comprising carbon between a region having a high interstitial concentration (around dotted line 68) and the implanted phosphorous of LDD regions (line 70). During the activation, interstitials will diffuse toward the implanted phosphorous. However, carbon in the interstitial blocker region will interact with the interstitials (occupy the interstitials) and trap the interstitials, so that it is difficult for the interstitials to diffuse into the LDD regions. Since phosphorous diffuses much further with the help of interstitials, the blocking of interstitials away from phosphorous significantly reduces the diffusion of phosphorous. Preferably, the portion of the PAI regions that have the highest interstitial concentration is deeper than the source/drain junction, so that leakage current from the source/drain regions into the substrate is reduced.

Figure 10:
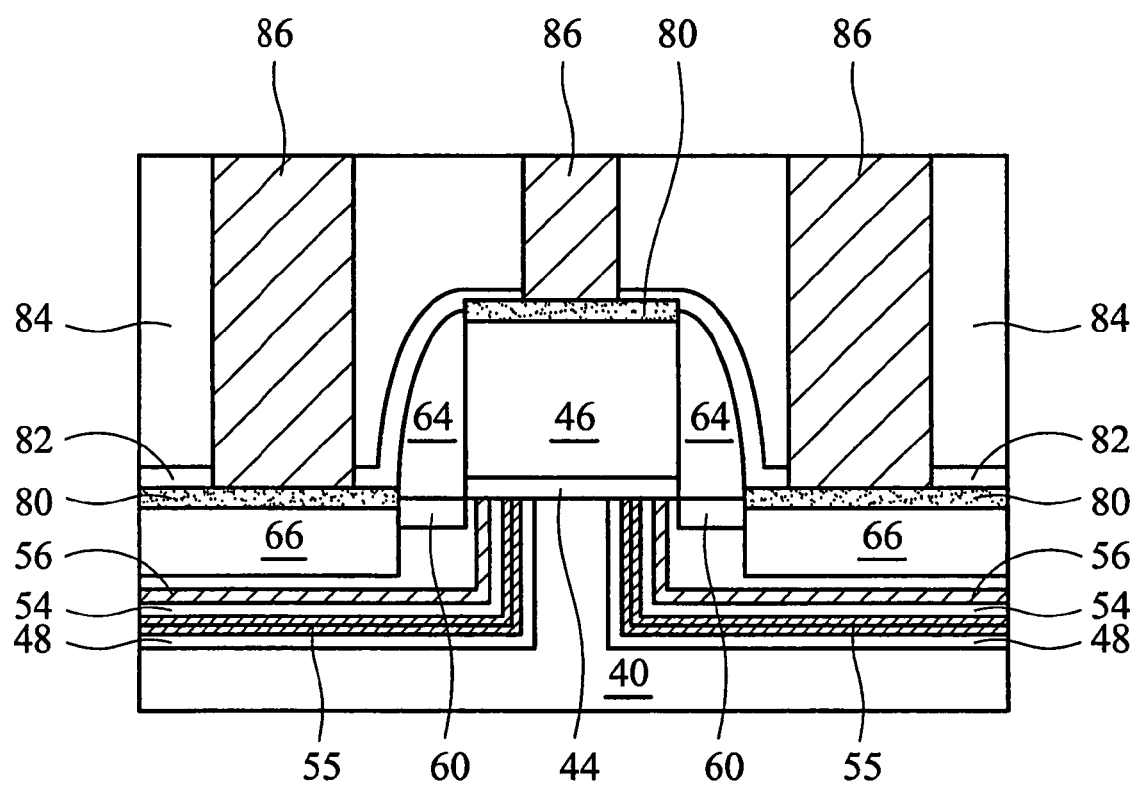
FIG. 10 illustrates an end structure of the preferred embodiment of the present invention.

FIG. 10 illustrates a structure after the formation of silicide regions 80, a contact etch stop layer (CESL) 82, an inter-layer dielectric (ILD) 84 and contact plugs 86. To form silicide regions 80, a thin layer of metal (not shown), such as cobalt, nickel, erbium, molybdenum, platinum, and the like, is first formed over the device. The device is then annealed to form silicide regions 80 between the deposited metal and the underlying exposed silicon regions. The remaining metal layer is then removed. CESL 82 is preferably blanket deposited. This layer serves two purposes. First, it provides a stress to the device and enhances carrier mobility. Second, it protects underlying regions from being over etched. Next, ILD 84 is deposited over the surface of CESL 82. Contact plugs 86 are then formed. The processes of forming such are well known in the art and therefore are not repeated herein.

Figure 11:
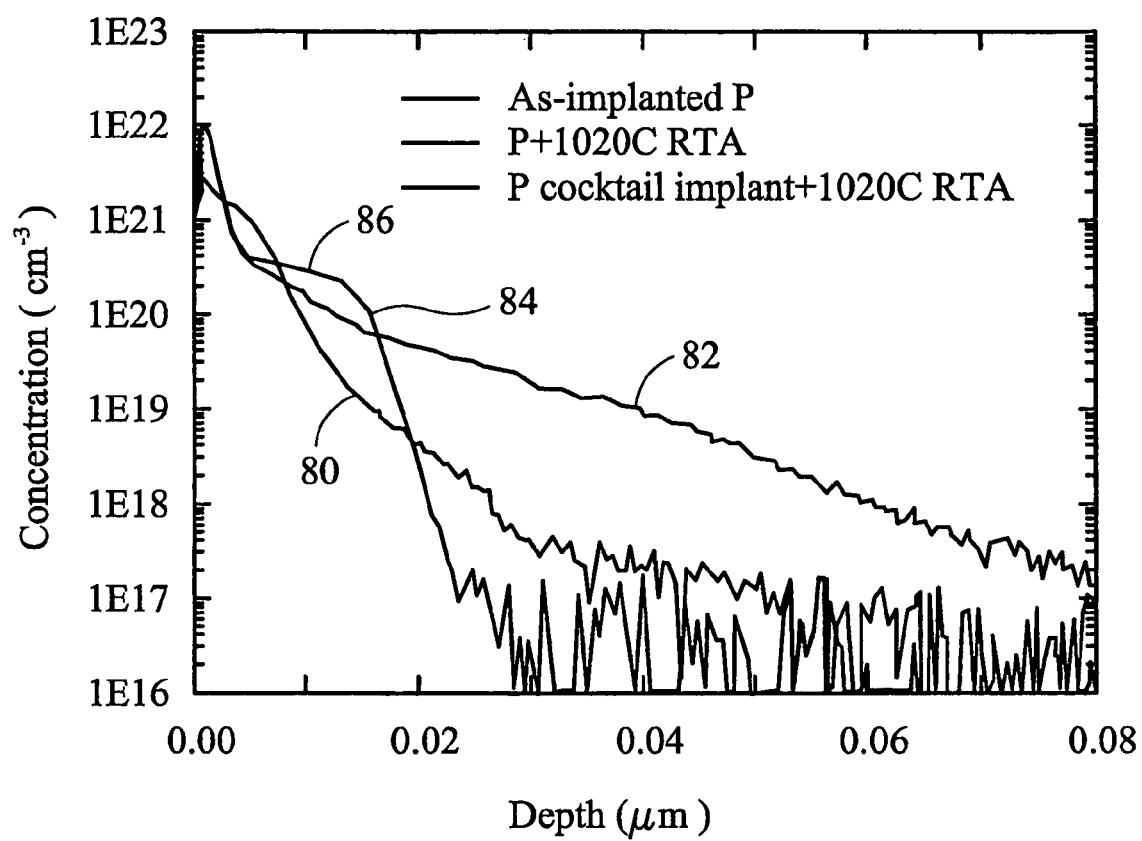
FIG. 11 illustrates phosphorous concentrations as a function of depth.

The effect of the preferred embodiments of the present invention is shown in FIG. 11, which illustrates phosphorous concentration as a function of depth. Line 80 shows the phosphorous distribution as implanted (before any annealing). Line 82 is obtained from a first sample device after a 1020° C. rapid thermal annealing (RTA) is performed, wherein the first sample device has no interstitial blocker regions formed. Line 84 is obtained from a second sample device formed using the preferred embodiment of the present invention. Compared to line 82, line 84 has a greater abruptness and suppressed diffusion. In addition, the activation level is higher for line 84 (point 86). The sheet resistance of the second sample device is about 374 Ω/Sqr. This is about a 32% improvement over conventional devices with arsenic LDD regions. The junction depth is about 17.6 nm, and junction abruptness is about 2.2 nm/decade.

Figure 12:
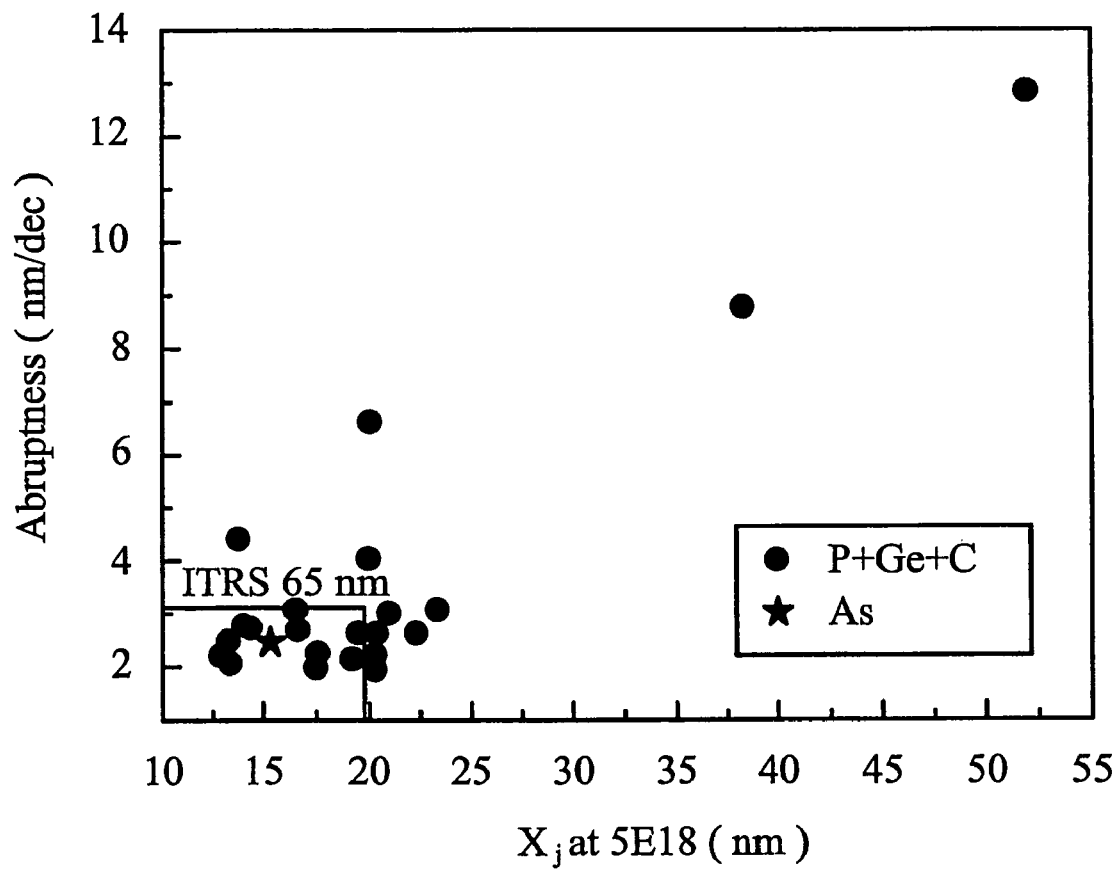
FIG. 12 illustrates abruptness of junctions as a function of junction depth.

FIG. 12 illustrates abruptness as a function of junction depth, which is determined based on an activation level of $5E18/cm^3$. The rectangle indicates the preferred ranges of the junction depth and abruptness of MOS devices if formed using 65 nm technology. It is noted that abruptness of junctions (solid circles) for the preferred MOS device embodiment can satisfy the requirement of 65 nm technology. The junction abruptness of MOS devices formed using the preferred embodiment is comparable to MOS devices (illustrated as a star) having arsenic in the LDD regions. However, MOS devices with arsenic LDD regions have higher sheet resistances than phosphorus source/drain regions and thus are inferior in performance.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a semiconductor substrate;
   a gate stack over the semiconductor substrate;
   a lightly doped n-type source/drain (LDD) region in the semiconductor substrate and adjacent the gate stack, wherein the LDD region comprises an n-type impurity;
   a heavily dope n-type source/drain (N+ S/D) region in the semiconductor substrate and adjacent the gate stack, the N+ S/D region comprising an n-type impurity;
   a pre-amorphized implantation (PAI) region in the semiconductor substrate; and
   an interstitial blocker region completely within the PAI region in the semiconductor substrate, wherein the interstitial blocker region is interposed between an end of range (EOR) region of the PAI region and the LDD region and is interposed between the EOR region and the N+ S/D region.

2. The semiconductor device of claim 1, wherein the n-type impurity in the LDD region comprises phosphorous.

3. The semiconductor device of claim 1, wherein the interstitial blocker region comprises carbon.

4. The semiconductor device of claim 1, wherein the PAI region comprises germanium.

5. The semiconductor device of claim 1, wherein a depth of the interstitial blocker region is between a depth of the LDD region and a depth of the N+ S/D region.

6. The semiconductor device of claim 1, wherein a depth of the interstitial blocker region is substantially the same as a depth of the N+ S/D region.

7. The semiconductor device of claim 1, wherein a depth of the interstitial blocker region is greater than a depth of the N+ S/D region.

8. The semiconductor device of claim 1, wherein the N+ S/D region comprises an impurity selected from the group consisting essentially of phosphorous, arsenic, and combinations thereof.

9. The semiconductor device of claim 8, wherein the impurity in the N+ S/D region only comprises phosphorous.

10. The semiconductor device of claim 1, wherein a channel region under the gate stack has at least one portion substantially free from the interstitial blocker region.

11. The semiconductor device of claim 1, wherein the interstitial blocker region has a carbon concentration of between about $5E14/cm^3$ and about $5E15/cm^3$.

* * * * *